July 25, 1939. J. W. ALEXANDER ET AL Re. 21,157

ANTENNA SYSTEM

Original Filed Feb. 27, 1932

Inventors
Johan Willem Alexander
and Herre Rinia
BY H. S. Grover
ATTORNEY

Reissued July 25, 1939 Re. 21,157

UNITED STATES PATENT OFFICE 21,157

ANTENNA SYSTEM

Johan Willem Alexander and Herre Rinia, Eindhoven, Netherlands, assignors to Radio Corporation of America, a corporation of Delaware Original No. 2,054,645, dated September 15, 1936, Serial No. 595,644, February 27, 1932. Application for reissue July 29, 1938, Serial No. 221,890. In Germany February 18, 1931

11 Claims. (Cl. 250—20)

The invention relates to a device for the reception of wireless signals in which the influence of sources of interference located in the neighborhood of the receiver is suppressed. As is well known use is made for this purpose of a device comprising an aerial system consisting of two or more aerials of different length which are inductively coupled with one or more receiving sets, the length of at least one of the aerials being so chosen that a considerable portion of this aerial is located outside the region of the sources of interference.

Obviously, the working of said device is based thereon that the aerials are inductively coupled with the input circuit of a receiver in such manner that the interfering oscillations received by the aerials neutralize each other whereas the difference of the wireless signals received by the aerials is made operative in the receiver.

This invention is not a static eliminator to eliminate atmospheric disturbances. Furthermore, this invention is not to be confused with inventions which are intended to eliminate or reduce atmospheric disturbances, but relates more particularly to antenna systems in which the effects of local disturbing oscillations are neutralized or balanced out by virtue of the signal impulses being received on two collecting devices differently located with respect to the source of the interfering or disturbing oscillations.

According to the invention, use is made of an inductive coupling device the primary side of which comprises one or more coils which are connected in series between the aerials and whose earthed electrical mid-point can be adjusted with the aid of one or more variable condensers.

If use is made of a device comprising an aerial system consisting of two aerials of different length, the primary side of the inductive coupling may, for example, comprise a coil which is connected between the aerials and both ends of which are earthed via condensers of which at least one is variable, or again use is made of a circuit-arrangement in which the primary side of the inductive coupling comprises two coils which are connected in series between the aerials and whose point of connection is earthed while at least the longest of the aerials includes a variable condenser.

According to the invention, the coupling of the aerials with the input circuit of the receiver is preferably mounted within an earthed metallic screening box for it has been found that the presence of such a box considerably improves the working of the device, and that the adjustment is made more stable, that is, less dependent on the state of the weather in the surroundings. The cause thereof principally resides in that between the two aerials and the receiver there exists a different capacitive coupling which transfers the interfering oscillations received by the aerials to the input circuit of the receiver.

The invention will be more clearly understood by referring to the accompanying drawing which represents schematically some embodiments thereof.

Figure 1:
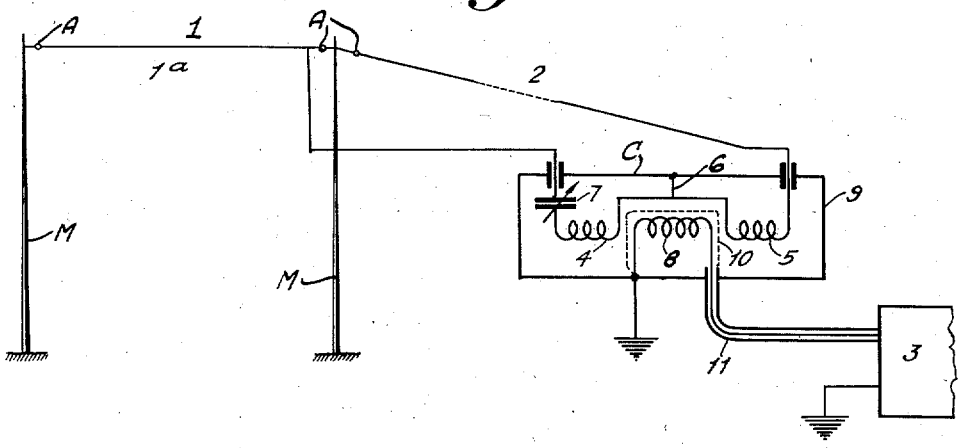
Fig. 1 shows an aerial system inductively coupled to a receiving set.

Fig. 1 represents an aerial system consisting of two aerials 1 and 2 which are supported by two masts M and insulated therefrom by suitable insulators A. The aerials 1 and 2 are inductively coupled by a coupling device C with a receiving set 3. The length of the aerial 1 is so chosen that the portion $1^a$ is substantially located outside the region of the sources of interference. The primary side of the inductive coupling comprises two coils 4 and 5 which are connected in series between the aerials 1 and 2 and whose connecting point 6 is earthed. The aerial 1 comprises furthermore a variable condenser 7 which is adjusted in such manner that for the received interfering oscillations the aerials 1 and 2 have the same electrical length or in other words that the interfering electro-motive forces induced by the coils 4 and 5 in the secondary side 8 of the inductive coupling neutralize each other whereas the difference of the wireless signals received in the aerials 1 and 2 is made operative in the receiver 3. The coils 4, 5 and 8 are arranged within an earthed metallic screening box 9 and between the coils 4 and 8 and 5 and 8 respectively, is preferably arranged a screen 10 (shown by the dotted lines) for avoiding a capacitive coupling, said screen being electrically connected to the screening box 9.

The supply wires leading from the secondary side 8 of the inductive coupling to the receiver 3 are preferably made as short as possible and in order to avoid a capacitive coupling between the aerials and these wires they are preferably capacitively screened by means of an earthed lead sheath 11.

Figure 2:
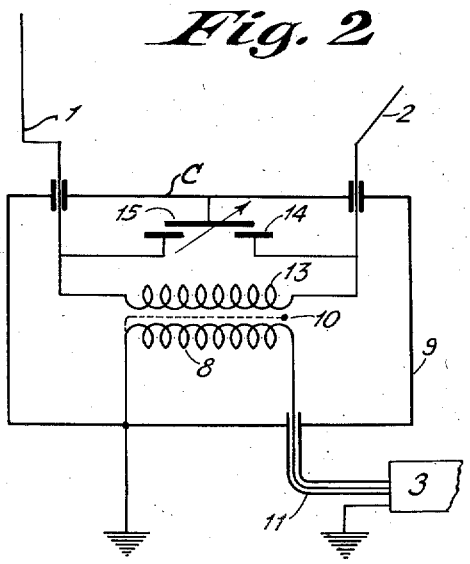
Fig. 2 shows a second embodiment of my improved inductively coupled aerial receiving system.

Fig. 2 represents a second embodiment of a device according to the invention, in which the primary side of the inductive coupling comprises between the aerials 1 and 2 a coil 13 the ends of which are connected to earth through a differential condenser 14 owing to the fact that the variable electrode 15 of this condenser is connected to the screening box 9. Between the primary and the secondary sides of the inductive coupling is arranged again a screen which prevents a capacitive coupling, said screen being also electrically connected to the screening box 9.

Figure 3:
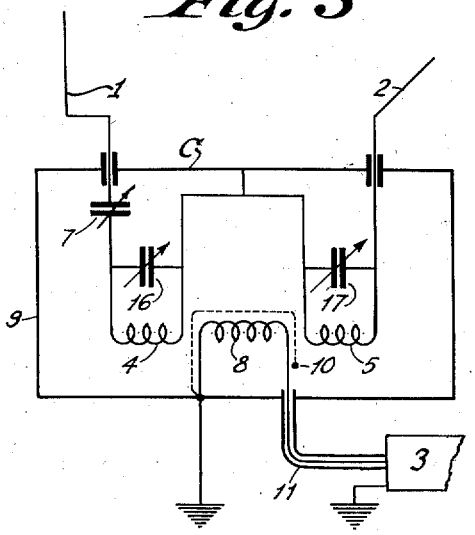
Fig. 3 shows another embodiment of my improved inductively coupled aerial receiving system.

Fig. 3 represents a device according to Fig. 1, in which in parallel with the coils 4 and 5 are arranged tuning condensers 16 and 17 with the aid of which the aerials 1 and 2 can be tuned to the wave-lengths to be received.

We claim:

1. A radio signalling system having means for the reduction of local interference, said means comprising two aerials each of different length, the length of at least one of said aerials being so chosen that a considerable portion of its length is located outside the region of the sources of interference, means for coupling said aerials with the input of a receiver, said means comprising an earthed metallic screened box, one of said aerials connected to a variable condenser within said screened box, the other aerial being connected to a first coupling coil, a second coupling coil connected to said variable condenser, and a third coupling coil connected to said receiver and inductively coupled to the first and second coupling coils, the other ends of said first, second and third coupling coils being grounded.

2. A radio signalling system having means for the reduction of local interference, said means comprising two aerials each of different length, the length of at least one of said aerials being so chosen that a considerable portion of its length is located outside the region of the sources of interference, means for coupling said aerials with the input of a receiver, said means comprising an earthed metallic screened box, one of said aerials connected to a variable condenser within said screened box which adjusts the aerial to have the same electrical length as the other aerial so that the local interference is neutralized, the other aerial being connected to a first coupling coil, a second coupling coil connected to said variable condenser, and a third coupling coil connected to said receiver and inductively coupled to the first and second coupling coils, the other ends of said first, second and third coupling coils being grounded.

3. A radio signalling system having means for the reduction of local interference, said means comprising a long and short aerial, the length of at least one of said aerials being so chosen that a considerable portion of its length is located outside the region of the sources of interference, means for coupling said aerials with the input of a receiver, said means comprising an earthed metallic screened box, the long aerial being connected to a variable condenser, and a plurality of inductance coils located within said metallic screened box, two of said coils serving as primary coils and being connected together at their ends and grounded to said box, the other end of one of said primary coils being connected to said variable condenser which is in series with said primary coils, the other end of the other primary coil being connected to the other aerial, a third coil coupled to the first mentioned coils, one side being connected to the receiver, the other end grounded to said screened box and a metallic screen around said third coil to avoid capacitive coupling between said first and second coils, said last mentioned screen grounded to said screened box.

4. A radio signalling system having means for the reduction of local interference, said means comprising two aerials each of different length, the length of at least one of said aerials being so chosen that a considerable portion of its length is located outside the region of the sources of interference, means for coupling said aerials with the input of a receiver, said means comprising an earthed metallic screened box, each one of said aerials being connected to the primary of an inductive coupler having a primary and secondary contained within said screened metallic box, a variable condenser having two fixed electrodes and a single variable electrode, the fixed electrodes of said variable condenser connected to each side of said aerials, said variable electrode of the variable condenser being connected to said screened box and a separate screen between the primary and secondary coils, one side of the secondary coil being grounded to the screened box, the other side of said secondary coil being connected to said receiver, the variable electrode of said condenser being arranged to adjust the electrical length of one of said aerials so that the interfering electro-motive forces induced by the said primary coils are neutralized in the said secondary coil and the difference of the desired signals received by said aerials are operative in the receiver.

5. A radio signalling system having means for the reduction of local interference, said means comprising two aerials of different length, the length of at least one of said aerials being so chosen that a considerable portion of its length is located outside the region of the sources of interference, means for coupling said aerials with the input of a receiver, said means comprising an earthed metallic screened box, three variable condensers within said screened box, the first one of which is connected in series with one of said aerials and a first coupling coil, the other aerial being connected to a second coupling coil, each second and third condenser being connected in parallel with each of said first and second coils so as to tune each of said aerials, a third coil coupled with the other coils, one side of which is connected to ground by means of said metallic box for screening the said condensers and said coils, the other side of the last-mentioned coil being connected to said receiver.

6. A radio signalling system having means for the reduction of local interference, said means comprising two aerials each of different length, the length of one of said aerials being so chosen that a considerable portion of its length is located outside the region of the sources of interference, means for coupling said aerials with the input of a receiver, said means comprising an earthed metallic screened box, each one of said aerials being connected to reactive elements within said box, one of said aerials being connected to one side of a variable condenser and the other aerial being directly connected to one side of the primary of a coupling coil, the secondary of said coupling coil being connected to one side of said receiver, and the other side of said secondary coil being grounded to said screen box.

7. In combination with a radio signal receiving set having input terminals, a signal pick-up system comprising an antenna of a length such that a portion thereof is located substantially outside the region of a source of interference, a second antenna located substantially inside said region, a transformer having a secondary winding connected between said input terminals and a primary winding connected in series between said antenna, condensive impedance connecting one end of said primary winding to a fixed alternating potential point, and means for adjusting the magnitude of said impedance thereby to adjust the position of the voltage node on said primary winding.

8. A noise reducing antenna system for a receiver located inside of a noise interference region, comprising a metallic conductor which is of a length such that it can be connected between the receiver and a point substantially outside said region of noise interference, a metallic conductor located inside said region, a coil connected in series between said two conductors, a second coil, magnetically coupled to the first coil, connected to the receiver input terminals, a condenser connected between one end of said first coil and ground, a second condenser connected between the opposite end of the first coil and ground, and means for adjusting the capacity magnitude of the first condenser whereby both conductors have the same electrical length for received noise interference impulses.

9. A noise reducing antenna system for a receiver located inside of a noise interference region, comprising a metallic conductor which is of a length such that it can be connected between the receiver and a point substantially outside said region of noise interference, a metallic conductor located inside said region, a coil connected in series between said two conductors, a second coil, magnetically coupled to the first coil, connected to the receiver input terminals, a condenser connected between one end of said first coil and ground, and means for adjusting the capacity magnitude of the condenser whereby both conductors have the same electrical length for received noise interference impulses.

10. A radio signalling system having means for the reduction of local interference, said means comprising two aerials each of different length, the length of one aerial being so chosen that a considerable portion of its length is located outside the region of the sources of interference, means for coupling said aerials with the input of a receiver, said coupling means consisting of a transformer whose primary winding has one end connected to said one aerial, the opposite end of said primary winding being connected to the second aerial, and a variable condenser connected between said one end of the primary winding and ground.

11. In combination with a radio receiver and a pair of antenna of different lengths, a transformer, said antennae being connected to the opposite terminals of the primary winding of said transformer, the receiver input terminals being connected to the transformer secondary winding, separate capacities to ground from said opposite terminals, and means for adjusting the magnitude of one of the capacities thereby to control the location of the electrical midpoint of the primary winding.

JOHAN WILLEM ALEXANDER.
HERRE RINIA.